United States Patent [19]

Sato

[11] 4,362,807
[45] Dec. 7, 1982

[54] PHOTOMASK-FORMING PHOTOGRAPHIC MATERIAL AND METHOD FOR PRODUCING PHOTOMASK USING SAME

[75] Inventor: Masamichi Sato, Asaka, Japan

[73] Assignee: Fuji Photo Film Co., Ltd., Kanagawa, Japan

[21] Appl. No.: 788,945

[22] Filed: Apr. 19, 1977

Related U.S. Application Data

[63] Continuation of Ser. No. 513,439, Oct. 9, 1974, abandoned.

[30] Foreign Application Priority Data

Oct. 9, 1973 [JP] Japan ................... 48-113629

[51] Int. Cl.³ .............................. G03C 5/00
[52] U.S. Cl. ......................... 430/276; 430/4; 430/5; 430/275; 430/321; 430/323; 430/531; 430/637
[58] Field of Search ............... 96/36, 38.3, 67, 87 R; 430/4, 5, 275, 276, 321, 323, 531, 637

[56] References Cited

U.S. PATENT DOCUMENTS

| | | | |
|---|---|---|---|
| 1,906,199 | 4/1933 | Rado | 96/86 R |
| 2,882,150 | 4/1959 | Van Allan et al. | 96/84 UV |
| 2,937,087 | 5/1960 | Forsgaro | 96/86 R |
| 2,999,016 | 9/1961 | Beeber et al. | 96/87 R |
| 3,484,154 | 12/1969 | Swing et al. | 96/38.3 X |
| 3,533,795 | 10/1970 | Blaumueller | 96/87 R |
| 3,561,963 | 2/1971 | Kiba | 96/38.3 X |
| 3,567,447 | 3/1971 | Chand | 96/36 |
| 3,639,125 | 2/1972 | Chand | 96/36.2 X |
| 3,669,665 | 6/1972 | Faigenbaum et al. | 96/36 |
| 3,674,492 | 7/1972 | Goldrick et al. | 96/68 |
| 3,754,913 | 8/1973 | Takeuchi et al. | 96/38.3 |
| 3,813,255 | 5/1974 | Mannens et al. | 96/84 UV |
| 3,864,132 | 2/1975 | Rasch et al. | 96/87 R |
| 3,961,962 | 6/1976 | Sato | 96/87 R |

Primary Examiner—Edward C. Kimlin
Assistant Examiner—Lois E. Boland
Attorney, Agent, or Firm—Sughrue, Mion, Zinn, Macpeak & Seas

[57] ABSTRACT

A photomask-forming photographic material which comprises a transparent support having a masking layer thereon, the masking layer having thereon at least one silver halide emulsion layer either directly or on at least one subbing layer on the masking layer.

2 Claims, 13 Drawing Figures

PHOTOMASK-FORMING PHOTOGRAPHIC MATERIAL AND METHOD FOR PRODUCING PHOTOMASK USING SAME

This is a continuation of application Ser. No. 513,439, filed Oct. 9, 1974, now abandoned.

BACKGROUND OF THE INVENTION

1. Field of the Invention

The present invention relates to a photographic material for use in forming a photomask and a method for producing a photomask using same. More particularly, it relates to a photographic material for use in forming a photomask having excellent quality using a silver halide photographic emulsion layer as a light-sensitive material and to a method for easily producing a photomask having high quality using the photographic material.

2. Description of the Prior Art

It is known in the field of printed circuit fabrication or microelectronic fabrication to use a photomask in forming images utilizing a photoresist method. Heretofore, silver images or chromium images have often been utilized in the photomask. Silver images are obtained by imagewise exposing a photographic light-sensitive material (so-called emulsion mask) provided on a glass plate, followed by conventional photographic processings (e.g., development and fixing). On the other hand, chromium images are formed by providing a vacuum-deposited chromium layer on a glass support and etching the chromium layer using a photo etching method. That is, a photoresist is coated on the chromium layer and, after exposing through a photomask superposed thereon (contact method) or after projecting a photomask on the photoresist (projection method), the photoresist is development-processed to form a resist image, followed by etching the chromium layer.

Since an emulsion mask has high sensitivity, it is suitable for preparing a photomask. However, the resolving power of the photomask obtained is inferior to that of a chromium mask using the projection method due to scattering of light by the silver grains, great thickness of the silver halide emulsion layer and silver particles after development. A photomask utilizing silver images is inferior in resolving power for the following additional reason. That is, since the developed emulsion thickness is larger at silver image areas than at nonimage areas, gaps or spaces are formed at the contact surfaces upon intimately contacting the photomask with the photoresist layer in order to form a resist image, thus markedly reducing the resolving power. In addition, a photomask formed by a silver image has such a small mechanical strength that it is easily damaged. Also, since a silver image does not transmit visible light, positioning of the mask is difficult.

On the other hand, a chromium mask using the contact method is inferior to a photomask obtained with silver images in resolving power, since the resolving power of a chromium mask is reduced on exposing a photoresist layer and upon etching the vacuum-deposited chromium layer. Also, with a chromium mask using a projection method, the photoresist layer has such a low sensitivity that exposure requires too much time, and thus it is difficult to use a chromium mask in this manner industrially. In addition, since the etching method results in environmental pollution through discharge of the used etching solution, it has become difficult to employ the etching method on an industrial scale.

SUMMARY OF THE INVENTION

It is, therefore, an object of the present invention to provide a method for producing a photomask having high sensitivity, high resolving power and excellent durability.

Another object of the present invention is to provide a method for producing a photomask without using a photoresist process.

A further object of the present invention is to provide a method for producing a photomask using a dry process which does not cause environmental pollution.

Still a further object of the present invention is to provide a photographic material for forming a photomask (hereinafter photomask-forming photographic material) which is suitable for the objects described immediately above.

The above-described objects of the present invention can be attained with a photomask-forming photographic material which comprises a support having a masking layer thereon, the masking layer having thereon at least one silver halide emulsion layer directly on the masking layer or using at least one subbing layer on the masking layer.

Also, the above-described objects of the present invention can be attained by exposing and development-processing the above-described photomask-forming photographic material to form a silver or silver halide image, imagewise ion-etching away the layer or layers above the masking layer to remove areas other than the silver or silver halide image areas to uncover the masking layer thereunder, removing the uncovered masking layer through ion-etching or chemical etching, and then removing the silver or silver halide image areas above the masking layer to uncover the masking layer.

Furthermore, the above-described objects of the present invention can be attained by imagewise exposing the above-described photomask-forming photographic material, conducting one of the following processings (a), (b) and (c) to imagewise uncover the masking layer, ion-etching away the masking layer at the uncovered areas, and then processing the photographic material so that the masking layer at the remaining areas is left:

(a) a processing sequence comprising development and etch-bleaching as essential steps;

(b) a processing sequence comprising development, tanning-bleaching and washing with warm water as essential steps; and (c) a processing sequence comprising tanning-development and washing with water as essential steps, whereby when processing sequence (a) or (b) is conducted, a photomask in which the masking layer at areas other than the former silver image areas remains, while, when processing sequence (c) is conducted, a photomask in which the masking layer at the former silver image areas remains.

BRIEF DESCRIPTION OF THE DRAWINGS

In each figure, numeral 1 designates a photographic light-sensitive material, 2 a transparent support, 3 a masking layer, 4 a silver halide emulsion layer, 3a a masking layer corresponding to the silver image areas, 3b a masking layer corresponding to the non-silver image areas, 4a silver image areas, 4b a binder layer (non-silver image areas), 4c image areas of silver halide or another silver compound or image areas wherein silver is removed by bleaching, 2a a transparent support surface corresponding to the silver image areas.

DETAILED DESCRIPTION OF THE INVENTION

The photographic material of the present invention fundamentally comprises a transparent support having thereon a masking layer and a silver halide emulsion layer. If necessary, at least one subbing layer can be interposed between the masking layer and the silver halide emulsion layer. That is, the photographic material of the present invention is different from conventional silver halide photographic materials in that it possesses a masking layer.

The transparent support designates a glass plate, quartz, sapphire, plastic film (e.g., a cellulose acetate film, a cellulose nitrate film, a polyethylene terephthalate film, a polystyrene film, heat resistive high melting polymer such as poly(pyromellitic acid-p-phenylenediamineimide), poly(p-oxybenzoate), poly(ethylene-2,6-naphthalate), polyamidoimide polymers as described in U.S. Pat. No. 3,554,984, polyimidoimine polymers as described in U.S. Pat. No. 3,472,815, etc.), and the like.

The support must be transparent since transparency is a necessary condition for mask-positioning as is well-known in the conventional photomask art. However, the transparent support is not particularly limited in the present invention with respect to its other characteristics.

The term "transparent support" as used herein in the present invention designates a support which comprises a substance capable of transmitting not less than 50%, preferably not less than 70%, of electromagnetic waves in the nearultraviolet (e.g., about 3000 Å to 4000 Å) and visible light regions (e.g., about 4500 Å to 7000 Å).

The masking layer is provided by depositing a masking material on a transparent support using vacuum deposition, sputtering, ion plating, chemical plating or the like. Suitable masking materials are metal oxides such as silicon dioxide, chromic oxide, ferric oxide, magnetic iron oxide, (iron(II) iron(III) oxide), cuprous oxide, cupric oxide, nickel oxide, cobalt oxide, germanium oxide, cadmium oxide, titanium oxide, or tantalum oxide, etc., metals such as chromium, aluminum, silver, titanium, cobalt, tungsten, tellurium, nickel, gold, platinum, iridium, palladium, rhodium, molybdenum, tantalum, a nickel-iron alloy, a nickel-chromium-iron alloy, an aluminum-iron alloy, a chromium-iron alloy, a chromium-aluminum alloy, a silicon-gold alloy, a titanium-aluminum alloy, a copper-beryllium alloy, a cobalt-iron alloy, a cobalt-nickel alloy, nickel-chromium alloy, etc., semi-metals such as silicon, germanium, etc., chalcogen glasses such as As-S-Ge, As-Se-Ge, Ge-S, etc., and the like. The masking material provides a masking effect, particularly, to light, and is preferably selected from those materials which transmit visible light and absorb ultraviolet light.

The thickness of the masking layer cannot be set forth unequivocally since thickness varies depending upon end-use thereof. However, in general, a thickness ranging from about $0.05\mu$ to $3\mu$ is employed. If the thickness is too small, absorption of ultraviolet light is too small, while if the thickness is too large, the etching takes much time and is therefore unpractical. Since a metal or metal oxide possesses much greater mechanical strength than a photographic emulsion layer or the like, the masking layer renders the photomask scratch resistant.

The subbing layer to be used in the present invention is a layer which intimately adheres to both the masking layer and the silver halide emulsion layer. Where the masking layer is extremely different in property from the silver halide emulsion layer, two or more subbing layers can be employed. More specifically, those subbing layers described in Japanese Patent Publication Nos. 5509/64, 2597/69, 11616/71, U.S. Pat. No. 3,492,122, West German Patent OLS No. 2,001,727, etc., are suitable. Also, a subbing layer formed by providing a thin polyvinyl acetate layer (for example, a thickness of about 0.1 to $0.3\mu$) and bringing the surface into contact with an alkaline aqueous solution such as an aqueous solution of sodium hydroxide for saponification can be used. A suitable thickness for the subbing layer can range from about 0.1 to $0.5\mu$.

The silver halide emulsion coated on the masking layer can be obtained by dispersing silver halide in an water-soluble binder. Illustrative silver halides are silver chloride, silver bromide, silver iodide, silver chlorobromide, silver bromoiodide, silver chlorobromoiodide, etc. A most typical silver halide emulsion is an emulsion which contains about 90 mol% or more silver bromide (preferably containing not more than about 5 mol% silver iodide) and contains silver halide grains of a mean grain size of not more than about $0.1\mu$ (a so-called Lippmann emulsion), and in which the weight ratio of silver halide to the water-soluble binder is about 1:4 to about 6:1. Another example of a silver halide emulsion is an emulsion which contains about 50 mol% or more (preferably 70 mol%) silver chloride and contains silver halide grains of a mean grain size of not more than about $1.0\mu$.

On the other hand, examples of water-soluble binders, e.g., gelatin, colloidal albumin, casein, cellulose derivatives (e.g., carboxymethyl cellulose, hydroxyethyl cellulose, etc.), saccharide derivatives (e.g., agar-agar, sodium alginate, starch derivative, etc.), synthetic hydrophilic colloids (e.g., polyvinyl alcohol, poly-N-vinyl pyrrolidone, polyacrylic acid copolymer, polyacrylamide, derivatives thereof, etc.). If desired, a compatible mixture of two or more of these binders can be used. Of these, a most preferred binder is gelatin. Gelatin can be replaced, partly or completely by a synthetic high molecular weight substance, by a so-called gelatin derivative (prepared by processing gelatin with a compound having a group capable of reacting with the functional groups contained in the gelatin molecule (i.e., amino groups, imino groups, hydroxy groups or carboxy groups)), or by a graft polymer prepared by grafting a molecular chain of other high molecular weight substances. Suitable compounds for preparing the gelatin derivatives, e.g., isocyanates, acid chlorides and acid anhydrides as described in U.S. Pat. No. 2,614,928, acid anhydrides as described in U.S. Pat. No. 3,118,766, bromoacetic acid as described in Japanese Patent Publication No. 5514/64, phenyl glycidyl ethers as described in Japanese Patent Publication No. 21845/67, vinyl sulfone compounds as described in U.S. Pat. No. 3,132,945, N-allylvinylsulfonamides as described in British Pat. No. 861,414, maleinimide compounds as described in U.S. Pat. No. 3,186,846, acrylonitriles as described in U.S. Pat. No. 2,594,293, polyalkylene oxides as described in U.S. Pat. No. 3,312,553, epoxy compounds as described in Japanese Patent Publication No. 26845/67, acid esters as described in U.S. Pat. No. 2,763,639, alkanesultones as described in British Pat. No. 1,033,189, and the like. Descriptions of suitable branch high polymers to be grafted on gelatin are given in U.S. Pat. Nos. 2,763,625; 2,831,767; 2,956,884; *Polymer Letters*, 5, 595 (1967), *Phot. Sci. Eng.*, 9, 148 (1965), *J. Polymer Sci. A*-1, 9, 3199 (1971), and the like. Homopolymers or copolymers of compounds which are generally called vinyl monomers, such as acrylic acid, methacrylic acid, the ester, amide, and nitrile derivatives thereof, styrene, etc., are widely used. Hydrophilic vinyl polymers having some compatibility with gelatin, such as homopolymers or copolymers of acrylic acid, acrylamide, methacrylamide, hydroxyalkyl acrylate, hydroxyalkyl methacrylate, etc., are particularly preferred.

These silver halide emulsions are advantageously optically sensitized with known optical sensitizers such as the cyanine dyes and merocyanine dyes as described in U.S. Pat. Nos. 1,346,301; 1,846,302; 1,942,854; 1,990,507; 2,493,747; 2,739,964; 2,493,748; 2,503,776; 2,519,001; 2,666,761; 2,734,900; 2,739,149; and British Pat. No. 450,958.

Suitable exposures of the silver halide emulsion can be electromagnetic radiation, to which the silver halide emulsion is sensitive, e.g., visible, ultraviolet, electron beams, X-ray etc. With the optically sensitized photographic light-sensitive materials, it is convenient to select light mainly having a wavelength corresponding to optically sensitized region of the emulsion as the light for exposing the emulsion layer.

The emulsion is advantageously chemically sensitized with salts of noble metals such as ruthenium, rhodium, palladium, iridium, platinum, etc., as described in U.S. Pat. Nos. 2,448,060; 2,566,245; and 2,566,263. Also, the emulsion can be chemically sensitized with a gold salt as described in U.S. Pat. No. 2,339,083 or stabilized with gold metal as described in U.S. Pat. Nos. 2,597,856 and 2,597,915. Furthermore, a thiopolymer as described in U.S. Pat. No. 3,046,129 can advantageously be incorporated in the emulsion. In addition, the emulsion can be stabilized with mercury compounds as described in U.S. Pat. No. 3,046,129, column 20, line 51 to column 21, line 3, triazoles, azaindenes, disulfides, quaternary benzothiazolium compounds, zinc salts and cadmium salts.

The emulsion can contain light-absorbing dyes as described in U.S. Pat. Nos. 2,527,583; 2,611,696; 3,247,127; 3,260,601; etc.

The emulsion is advantageously hardened with a suitable hardening agent for hydrophilic colloids, such as formaldehyde or a like hardener; N-methylol compounds as described in U.S. Pat. Nos. 2,732,316 and 2,586,168; carbodiimide compounds as described in U.S. Pat. No. 3,100,704; epoxy compounds as described in U.S. Pat. No. 3,091,537; halogen-substituted fatty acids (e.g., mucobromic acid, etc.); compounds having many acid anhydride groups; methanesulfonic acid biester; dialdehydes or the sodium bisulfite adducts thereof such as β-methylglutaraldehyde bissodium bisulfite; bisaziridinecarboxamide (e.g., trimethylene-bis(1-aziridinecarboxamide)); triazine derivatives (e.g., 2-hydroxy-4,6-dichloro-s-triazine, etc.); and the like.

The silver halide emulsion is coated on a masking layer or after adding a coating aid as described in U.S. Pat. No. 3,046,129. The silver halide emulsion layer can have a thickness of about $0.3\mu$ or above and preferably has a thickness of less than about $10\mu$ and can be coated in one or more layers on the masking layer.

If desired, a backing layer, an antihalation layer, an interlayer, an uppermost layer (e.g., a protective layer, etc.), and the like can be provided on the support, the masking layer or on the emulsion layer.

Formation of a silver image in the silver halide emulsion layer can be effected using conventional photographic processings, that is, by development-processing the exposed emulsion layer and, if necessary, fixing. Conventional photographic processings including exposure, development, fixing, etc., which can be used are described in detail in "Techniques of Microphotography" *Kodak Data Book P*-52.

Developing agents, which can be used in the method of the present invention for forming silver images, are those well known in the art, and include developing agents such as the dihydroxybenzenes (e.g., hydroquinone, chlorohydroquinone, bromohydroquinone, isopropylhydroquinone, toluhydroquinone, methylhydroquinone, 2,3-dichlorohydroquinone, 2,5-dimethylhydroquinone, etc.), the 3-pyrazolidones (e.g., 1-phenyl-3-pyrazolidone, 1-phenyl-4-methyl-3-pyrazolidone, 1-phenyl-4,4-dimethyl-3-pyrazolidone, 1-phenyl-4-ethyl-3-pyrazolidone, 1-phenyl-5-methyl-3-pyrazolidone, etc.), the aminophenols (e.g., o-aminophenol, p-aminophenol, N-methyl-o-aminophenol, N-methyl-p-aminophenol, 2,4-diaminophenol, etc.), pyrogallol, ascorbic acid, the 1-aryl-3-aminopyrazolines (e.g., 1-(p-hydroxyphenyl)-3-aminopyrazoline, 1-(p-methylaminophenyl)-3-pyrazoline, 1-(p-aminophenyl)-3-pyrazoline, 1-(p-amino-m-methylphenyl)-3-aminopyrazoline, etc.), and mixtures thereof. The developer generally possesses a pH of not less than about 8, preferably about $8.5 \sim 12.5$.

The developer can contain, if desired, a preservative (e.g., a sulfite, a bisulfite, etc.), a buffer (e.g., a carbonate, boric acid, borate, an alkanolamine, etc.), a dissolving aid (e.g., polyethylene glycol, etc.), a pH-adjusting agent (e.g., acetic acid or a like organic acid, etc.), a sensitizing agent (e.g., a quaternary ammonium salt, etc.), a development accelerator, a surface active agent, etc.

On the other hand, suitable fixing agents for the silver halide are the generally well-known solvents for silver halide, such as a water-soluble thiosulfate (e.g., potassium thiosulfate, sodium thiosulfate, ammonium thiosulfate, etc.), a water-soluble thiocyanate (e.g., potassium thiocyanate, sodium thiocyanate, ammonium thiocyanate, etc.), a water-soluble organic diol (e.g., 3-thia-1,5-pentanediol, 3,6-dithia-1,8-octanediol, 3,6,9-trithia-1,11-undecanediol, 3,6,9,12-tetrathia-1,14-tetradecanediol, etc.), a water-soluble sulfur-containing organic dibasic acid (e.g., ethylenebisthioglycolic acid, etc.), a water-soluble salt thereof (e.g., sodium ethylenebisthioglycolate and potassium ethylenebisthioglycolate), and a mixture thereof.

The fixing agent-containing solution can contain, if desired, a preservative (e.g., a sulfite, a bisulfite, etc.), a pH-buffer (e.g., boric acid, a borate, etc.), a pH-adjusting agent (e.g., acetic acid, etc.), a chelating agent, and the like.

Thus, a silver image is formed in the exposed areas. In the unexposed areas, the silver halide is removed through fixation, while the binder in the silver halide emulsion layer remains intact. Where a silver halide emulsion is a reversal-type emulsion or where reversal processing is conducted, the binder layer remains in exposed areas, whereas in the unexposed areas, silver halide remains to form a silver halide image or a silver image is formed by developing the silver halide image. The silver image formed at this stage is so poor in mechanical strength that it is difficult to use it many times as a photomask. Additionally, the term "non-silver image areas" or "non-silver halide image areas" (non-image areas) as used herein designates areas other than silver image areas or silver halide image areas (image areas). The terms "silver image areas" or "silver halide image areas" and "non-silver image areas" or "non-silver halide image areas" do not necessarily mean light exposed areas and light unexposed areas, respectively. Image areas and non-image areas do not necessarily designate images or non-images formed by silver or silver halide and, in some cases, they mean image areas or non-image areas formed by a binder.

The photographic material in which the silver or silver halide image is formed is then ion-etched. The term "ion-etching" as used herein in the present invention designates the procedure of bombarding ions having a high energy against a substance so that the substance bombarded is removed. (See R. G. Wilson & G. R. Brewer, *ION BEAMS With Application to Ion Implantation* pp. 317~335, John Wiley & Sons, (1973) and L. I. Maissel & R. Glang, *Handbook of Thin Film Technology* pp. 7-49~7-53, McGraw-Hill, (1971).) One example of ion-etching is cathode sputtering. However, it is clear from the principle of the present invention that the ion-bombarding technique employable in the present invention is not limited only to sputtering. It is needless to say that, any ion-bombarding techniques developed which can cause removal of the substance bombarded can be employed. Therefore, cathode sputtering is only an example of the ion-etching of the present invention to preferentially remove the non-image areas from a photographic material.

It has heretofore been known that sputtering causes etching. However, until now it has not been known that the rate at which non-silver image areas are ion-etched or sputter-etched is greater than the rate in the image areas. That is, the discovery of this phenomenon is an important aspect of the present invention. In fact, it has been confirmed that, when a coated surface of a photographic material (i.e., silver or silver halide image areas and a binder layer) is subjected to cathode sputtering, the non-image areas are etched away while the image areas are decreased in thickness, although at an extremely slow rate. Therefore, ion-etching is satisfactorily effected when the non-silver image areas are removed to uncover the underlying masking layer while the image areas remain. That is, although ion-etching depends upon the sputtering conditions (frequency, power and distance between electrodes), it is satisfactorily effected so that a photographic material is not charged to prevent sputtering. Further, the binder in the non-image portion is not necessarily removed completely by sputter etching of the emulsion layer and can remain in a small amount. The binder can be present in the non-image portion in such an amount that the etching solution can penetrate into the emulsion layer.

In ion-etching a direct current, an alternating current or the combination of a direct current and an alternating current can be used. An alternating current is preferred where the material to be etched is insulating. Suitable electrodes which can be used include any solid conductor. Suitable sizes can range from several cm to several tens of cm or more depending on the capacity of the electric power source. The electrodes can have a circular, square or rectangular shape. The size of the electrodes can vary widely with the photographic material to be etched. Generally, the electrodes have a somewhat larger size than that of the photographic material, e.g., about 1 to about 2 cm larger than the size of photographic material. A typical size is about 2 to about 50 cm in diameter when the electrodes are circular (disc shaped) in shape and can range from about 1 m in length when they are rectangular in form. A suitable electrode separation distance can range from several cm to several tens of cm and will vary with the voltage applied. The higher the voltage the larger the separation distance. A suitable separation is generally about 3 cm to about 15 cm. The voltage employed can range from several hundred volts to several tens of kv, e.g., from about 500 v to 30 kv, with a frequency ranging from about 10 to 30 MHz when an alternating current is employed. A suitable temperature which can be used ranges from about room temperature (e.g., about 20°~30° C.) to about 600° C., the upper limit thereof corresponding to that of baking temperature described hereinafter and a suitable pressure can range from about $10^{-3}$ to $10^{-1}$ Torr. The ion-etching can be conducted in a gaseous atmosphere such as in air, argon, nitrogen, oxygen, hydrogen, helium, xenon, krypton, carbon monooxide, carbon dioxide, etc., or a mixture thereof. The time generally ranges from several tens of seconds to several tens of minutes (e.g., about 20 seconds to about 1 hour). Ion etching of both the silver halide emulsion layer and the masking layer under the above-described conditions can be suitably employed, and the above parameters are to be considered as exemplary and are not to be construed as limiting.

It is preferable to subject a photographic material to various processings before this step so that the ion-etching can be conducted more effectively. For example, when the silver image is bleached with a bleaching solution such as a dichromate after conducting development (and, if necessary, fixing), the image is not destroyed in the subsequent ion-etching since the binder in the silver image areas is hardened. Also, the same applies in dissolving, after bleaching, the silver halide corresponding to the silver image areas with a fixing solution as described before. The same applies in developing this silver halide with a developer as described before to revert to a silver image. Furthermore, the same applies in effecting ion-etching after baking the silver or silver halide image areas formed in the preceding step and a binder layer. Baking can effected by heating in a vacuum or in an atmosphere of oxygen, nitrogen, argon, helium, air, etc., preferably air, at temperatures above about 150° C., preferably 300° to 500° C. to decompose the binder. If the heating temperature is lower than about 150° C., the baking takes a long time, while, if the temperature is higher than 500° C. the support might be deformed.

The above-described chemical auxiliary processings are conducted in order to make the binder layer at image areas stronger than the binder at non-image areas. Also, baking is markedly effective for accelerating the ion-etching rate.

It has been found that the resolving power and sharpness of the silver image obtained by the sputter-etching of the emulsion layer in comparison with the original silver image formed in the emulsion layer using known methods increase greatly. Furthermore, it has been surprisingly found that fringe or halo which sometimes accompanies a silver image formed in the silver halide emulsion layer by contact printing disappears by the sputter-etching.

Thus, the silver image (or the corresponding silver halide image) areas and a masking layer lying thereunder remain, while the non-image areas are removed to uncover the masking layer lying thereunder. Then the masking layer at the non-image areas is removed by ion-etching or chemical etching. Finally, the silver image areas are removed by swelling or the like to leave only the corresponding masking layer. Thus, a photomask is obtained.

Chemical etching as used in this invention includes the so-called etching and etch-bleaching. Etching is effected using methods usually employed for the metal or the metal oxide. Suitable etching solutions which can be used for chromium and chromium oxide ($Cr_2O_3$) include an aqueous solution of cerium ammonium nitrate (at a concentration of about 80 to 250 g/l) and 70 wt% perchloric acid (in an amount of about 20 to 80 ml/l) with an etching time of about 15 sec to 10 min at a temperature of about 15° to 40° C., or an aqueous solution of cerium (IV) sulfate (at a concentration of about 40 to 200 g/l) and concentrated (98%) sulfuric acid (in an amount of about 20 to 100 ml/l) with an etching time of about 20 sec to about 10 min at a temperature of about 15° to 40° C., etc., for iron oxide include an aqueous solution of hydrochloric acid (at a concentration of about 1 to 12 N) with an etching time of about 10 sec to 4 min at a temperature of about 30° to 60° C., etc., for silicon dioxide include hydrofluoric acid in an aqueous solution (at a concentration of about 6 to 48% by weight) with an etching time of about 10 sec to 1 min at a temperature of about 15° to 40° C., a mixture of about 0.5 to 2 parts by volume of hydrofluoric acid (48% by weight aqueous solution) and about 6 to 24 parts by volume of ammonium fluoride (40% by weight aqueous solution) with an etching time of about 30 sec to 5 min at a temperature of about 15° to 40° C., etc., for nickel include an aqueous solution of ferric chloride (at a concentration of about 5 to 300 g/l) with an etching time of about 1 to 5 min at a temperature of about 15° to 40° C., for titanium include an aqueous solution of hydrofluoric acid (at a concentration of about 5 to 40% by weight) with an etching time of about 20 sec to 2 min at a temperature of about 20° to 40° C., etc.

The thus obtained photomask forms a mask image which is in negative-positive relationship with an original. As was described before, a mask image in a positive-positive relationship with an original can be obtained by using a reversal emulsion and/or conducting reversal processing.

The following method is another embodiment of the present invention. That is, the method comprises imagewise exposing and development-processing a silver halide emulsion layer, etch-bleaching the silver image areas, without or after fixing, to uncover only the masking layer at the areas (the binder layer remaining at the non-silver image areas).

Another embodiment is a method which comprises imagewise exposing and tanning-developing the silver halide emulsion layer, washing away the binder at the non-silver image areas with warm water, e.g., at about 40° to 70° C., preferably 45° to 60° C., after or without fixing, to imagewise uncover the masking layer (the silver image areas remaining together with the binder), or which comprises imagewise exposing and developing a silver halide emulsion layer and, with or without fixing, washing away, e.g., with warm water, the binder at the non-silver image areas to uncover the masking layer (the silver image areas remaining together with the binder). Tanning development is known in the art, for example, as described in P. Glafkides, *Photographic Chemistry* Vol. 2, pp. 664~666, Fountain Press, London.

A still further embodiment is a method which comprises exposing and developing a silver halide emulsion layer and, with or without fixing, tanning-bleaching the silver halide emulsion layer, then washing away the binder at the non-silver image areas to uncover the masking layer (the silver image becoming a silver salt image and remaining together with the binder).

In each embodiment, the uncovered masking layer is subsequently ion-etched to uncover the transparent support at these areas. Then, the binder layer is swollen or dissolved for removal together with the silver or silver salt which remains in some cases depending upon the preceding processings. The removal of binder can be effected by using an alkali (e.g., an aqueous solution of sodium hydroxide or potassium hydroxide at a concentration of about 10 to 20% by weight at about 40° to 60° C. for about 2 to 10 min, etc.), an acid (e.g., a concentrated sulfuric acid (98% by weight) at about 60° to 98° C. for about 5 to 10 min, or concentrated nitric acid (70% by weight) at about 60° to 95° C. for about 2 to 10 min, etc.) or salt (e.g., an aqueous solution of sodium hypochlorite or potassium hypochlorite at a concentration of about 10 to 20% by weight at about 30° to 60° C. for about 1 to 5 min, etc.). Also, in each embodiment described above, a reversal emulsion and/or reversal processing can be employed.

Etch-bleaching designates a processing method utilizing the phenomenon that, when the silver image-containing layer is processed with an etch-bleaching solution, the silver image areas are removed from the support together with the binder. The composition of the etch-bleaching solution can be appropriately selected from among those already known. Suitable etch-bleaching solutions which can be used are described in *TAGA Proceedings*, pp 1~11, (1967) and *PSA Technical Quarterly*, Nov. 1955, pp 130~134. For example, a composition comprising cupric chloride, citric acid and an aqueous solution of hydrogen peroxide; a composition comprising cupric nitrate, potassium bromide, lactic acid and an aqueous solution of hydrogen peroxide; a composition comprising ferric nitrate, potassium bromide, lactic acid and an aqueous solution of hydrogen peroxide; and the like can be used. Since the completion of etch-bleaching processing is recognizable by the complete disappearance of the silver image, the particular processing time can be easily determined. Generally, etch-bleaching is completed in about 2 to 10 minutes at about 15° to 50° C., preferably 20° to 30° C.

Another method to imagewise uncover the masking layer comprises tanning-bleaching the silver image to harden the image, followed by washing away the non-image areas with warm water. For this purpose, the emulsion layer is preferably unhardened or only slightly hardened. Tanning-bleaching designates a processing utilizing the phenomenon that the binder at image areas is hardened upon bleaching the silver image areas. A typical bleaching solution is an aqueous solution of a mixture of potassium dichromate and hydrochloric acid. In addition, ammonium dichromate, sodium dichromate, etc., can be used. Also, sulfuric acid, nitric acid and the like can be used in place of the hydrochloric acid. Since the hardened image areas are not dissolved with warm water, only the masking layer at the non-image areas is uncovered. Tanning-bleaching and compositions which can be used are described in detail in P. Glafkides, *Photographic Chemistry* Vol. 2, pp 666~667, Fountain Press, London.

A further method to imagewise uncover the masking layer comprises hardening the silver image areas upon development by tanning development, and then non-image areas are washed away with warm water. Tanning development can be effected using known methods.

The non-tanned gelatin-containing binder areas can be washed away by using warm water of at a temperature of about 40° to 70° C., preferably 45° to 60° C. If the temperature of the washing water is lower than 40° C., the non-tanned gelatin-containing binder is substantially not dissolved, while if the temperature is higher than 70° C., there is the possibility that the tanned gelatin-containing binder will be dissolved.

The present invention is illustrated in greater detail, by reference to the accompanying drawings.

FIGS. 1 through 6 schematically illustrate an embodiment of the method of the present invention by which a photomask is produced.

Figure 1:
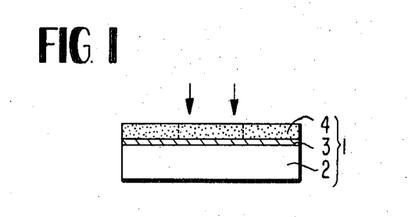
FIGS. 1 through 6 are illustrations showing one embodiment of the method of the present invention.
Figure 2:
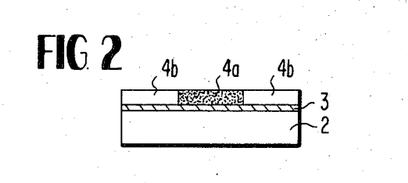
Figure 3:
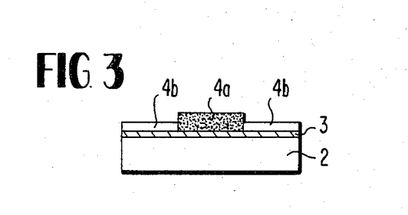
Figure 4:
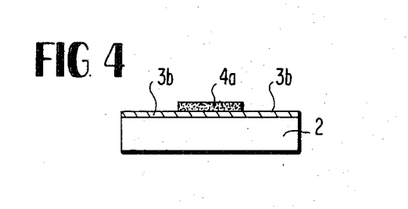
Figure 5:
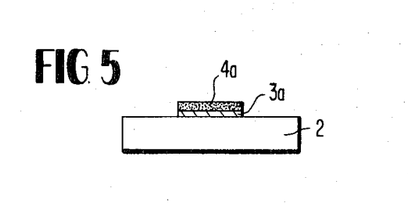
Figure 6:
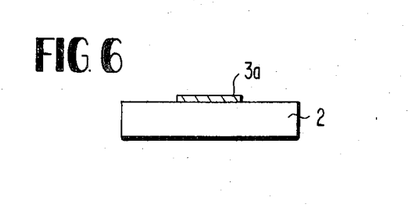
Figure 7:
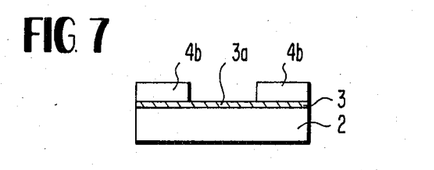
FIGS. 7 and 8 are illustrations showing another embodiment of the method of the present invention.

In FIG. 1, photographic light-sensitive material 1 comprises transparent support 2 having thereon masking layer 3 and silver halide emulsion layer 4. When photographic light-sensitive material 1 is exposed in the direction indicated by the arrows and then development-processed and fixed, silver image areas 4a and binder layer (non-silver image areas) 4b are formed as illustrated in FIG. 2. When the photographic material is ion-etched, binder layer 4b is gradually removed as illustrated in FIG. 3 and, in the end, masking layer 3b lying thereunder is uncovered (FIG. 4). Then, upon ion-etching or chemical etching masking layer 3b, only silver image areas 4a and masking layer 3a remain and masking layer 3b is removed. Finally, silver image areas 4a are removed to leave masking layer 3a. Thus, a photomask is obtained (FIG. 6).

Figure 8:
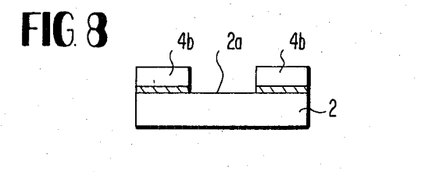

FIGS. 7 to 13 schematically illustrate another embodiment of the method of the present invention by which a photomask is produced. These figures show the steps wherein silver image areas 4a shown in FIG. 2 are etch-bleached to uncover masking layer 3a lying thereunder (FIG. 7), and masking layer 3a is removed by ion-etching to uncover transparent support 2a (FIG. 8). Binder layer (non-silver image areas) 4b in FIG. 8 is then removed to form a photomask.

Figure 9:
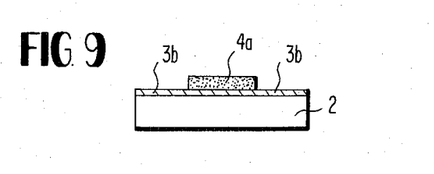
FIGS. 9 and 10 are illustrations showing a further embodiment of the method of the present invention.
Figure 10:
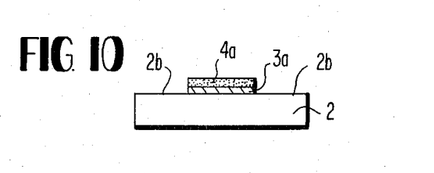
Figure 11:
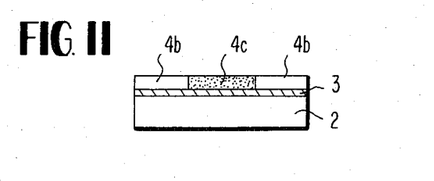
FIGS. 11 to 13 are illustrations showing an even further embodiment of the method of the present invention.

When the development for forming silver image 4a shown in FIG. 2 is conducted using a tanning developer, the binder at the silver image areas is hardened. Therefore, when washed with warm water, only the binder at the non-silver image areas is washed away to uncover masking layer 3b (FIG. 9). Then, the uncovered masking layer is ion-etched in a similar manner to FIG. 8 to uncover transparent support 2b (FIG. 10). Silver-containing binder layer 4a is then removed to form a photomask. However, the step is not always necessary.

Figure 12:
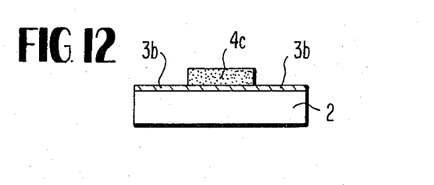
Figure 13:
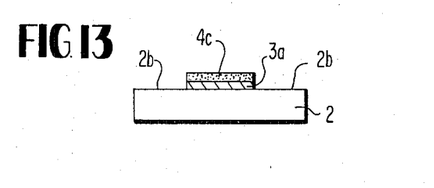

Also, when silver image 4a shown in FIG. 2 is tanning-bleached (FIG. 11), only the image areas are hardened. Therefore, when washed with warm water, the non-image areas are washed away to uncover masking layer 3b (FIG. 12). Then, the uncovered masking layer is ion-etched to uncover transparent support 2b (FIG. 13). Silver compound-containing or silver compound-free binder layer 4c is then removed to form a photomask. However, this step is not always necessary.

According to the method of the present invention, a photomask can be produced without using a photoresist method, and thus steps are simplified.

In addition, the resulting photomask possesses high resolving power, high sensitivity and markedly improved durability. In particular, since ion-etching is employed, the problem of environmental pollution is not caused. In addition, industrial production is facilitated since ion-etching is a dry process. Also, the formation of a resist image and the etching of a masking layer can be conducted in a completely dry process.

In the present invention, the optical density of silver image need not necessarily be that of ordinary silver halide photography. The silver image functions only as a medium for converting an emulsion layer to a resist image corresponding to an original image. That is, in ordinary photography, the optical density of silver image decreases, with the reduction in thickness of the emulsion layer, to such an extent that it cannot be practically usable, while, in the present invention, the thickness of the emulsion layer is such that the emulsion layer is removed according to original image to form a resist image of the emulsion layer. Therefore, a film thickness as thin as about 1/15 that necessary for obtaining sufficient optical density using an ordinary photographic emulsion is employable (provided that the proportion of silver in the emulsion is the same). The thinness of the emulsion layer provides the following advantages, and the resulting image is superior to that obtained by ordinary photography. A first advantage is that the thinness serves to reduce the scattering of light by the silver halide grains in the emulsion layer, thus improving the resolving power. A second advantage is that the thinness enables an image projected on an emulsion layer through a lens to be focused. That is, in an optical system to obtain a resolving power of 500~1000 lines/mm, the focal depth is around $5\mu$, and hence the thickness of the emulsion is desirably much less than this. However, an ordinary silver halide photographic emulsion has a thickness of $5\mu$ or higher. A third advantage is that the thinness reduces the reduction in resolving power due to halation. A fourth advantage is that, in the conducting etch-bleaching or a like chemical processing or baking, the thinness serves to improve the resolving power. A fifth advantage is that less silver is used.

Since the present invention employs conventional techniques used industrially in photo lithography, photo-etching and ion-etching in producing semi-conductor devices, it can be practiced almost without altering conventional techniques, apparatus and equipment, and the effects of the invention in this field are extremely great.

The following examples are given to illustrate the invention in greater detail. Unless otherwise indicated, all parts, percents, ratios and the like are by weight.

EXAMPLE 1

1400 ml of a silver bromide emulsion (mean grain size of silver bromide: about 0.06µ) was prepared using 50 g of gelatin and 188 g of silver bromide. To this emulsion was added 0.25 g of 4-methyl-2,3-di-ethoxathiazolocarbocyanine iodide to optically sensitize the emulsion to light of a wavelength of 510 mµ~530 mµ. Then, the emulsion was coated in a thickness of about 6µ on a chromium layer of a thickness of about 0.1µ vacuum-deposited on a glass plate, and then dried to obtain a photographic light-sensitive material. This photographic light-sensitive material was imagewise exposed and development-processed in a developer having the following composition (24° C., 5 min), followed by fixing in a fixing solution (24° C., 1 min) to obtain a silver image.

| Developer | |
| --- | --- |
| 1-Phenyl-3-pyrazolidone | 0.5 g |
| Sodium Sulfite | 50 g |
| Hydroquinone | 12 g |
| Sodium Carbonate (monohydrate) | 60 g |
| Potassium Bromide | 2 g |
| Benzotriazole | 0.2 g |
| 1-Phenylmercaptotetrazole | 5 mg |
| Phenazine-2-carboxylic Acid | 1 g |
| Water to make | 1 l |
| Fixing Solution | |
| 70% Ammonium Thiosulfate Aqueous Solution | 200 cc |
| Sodium Sulfite | 15 g |
| Boric Acid | 8 g |
| Glacial Acetic Acid | 16 cc |
| Ammonium Sulfate | 10 g |
| Sulfuric Acid | 2 cc |
| Water to make | 1 l |

After drying, the photographic material was placed in a sputtering apparatus (model "FP-46"; made by Nippon Electric-Varian K.K., Ltd.) to conduct ion-etching. The conditions of ion-etching were as follows: frequency: 13.56 MHz; high frequency power: 500 w; distance between electrodes: 50 mm; gas pressure: $1.2 \times 10^{-2}$ mmHg (argon). About 60 minutes were required to completely remove the non-silver image gelatin layer. The silver image remained without being completely etched away. Subsequently, the photographic material was heated for 2 minutes at about 350° C. in air and immersed for about 1 minute in an etching solution having the following composition. Thus, exposed chromium layer was removed.

| Etching Solution | |
| --- | --- |
| Cerium Ammonium Nitrate | 164.5 g |
| 70% Perchloric Acid | 43 ml |
| Water to make | 1 l |

Finally, the photographic material was immersed for 3 minutes in a 20% sodium hydroxide aqueous solution at 40° C. to leave only the chromium layer corresponding to the silver image. The thus obtained chromium mask can be used as a photomask having high sensitivity, high resolving power and good durability.

EXAMPLE 2

The same procedures as described in Example 1 were conducted except for changing the argon to oxygen. In this case, sputtering required about 35 minutes.

EXAMPLE 3

The same procedures as described in Example 1 were conducted except for additionally conducting a step of bleaching the silver image using a bleaching solution having the following composition before conducting the ion-etching. The thus obtained photomask was more excellent in edge acuity than in Example 1.

| Bleaching Solution | |
| --- | --- |
| Potassium Dichromate | 20 g |
| Hydrochloric Acid (36%) | 10 ml |
| Water to make | 1 l |

EXAMPLE 4

The same procedures as described in Example 1 were conducted except for additionally bleaching the silver image using the same bleaching solution as described in Example 3 and fixing using the same fixing solution as described in Example 1, before ion-etching. Thus, the same results as in Example 3 were obtained. In this Example, baking was not conducted.

EXAMPLE 5

The same procedures as described in Example 4 were conducted except for developing, without fixing after bleaching, using the same developer as described in Example 1 to again form a silver image. Thus, the same results as in Example 3 were obtained.

EXAMPLE 6

The same procedures as described in Example 1 were conducted except for heating the silver image for 3 minutes at 400° C. (baking) before ion-etching. Ion-etching required about 10 minutes. The silver image areas were not destroyed at all, and the resulting masking layer was very distinct.

EXAMPLE 7

The same procedures as described in Example 6 were conducted except for conducting the same bleaching as in Example 3 before baking. Thus, a photomask having about the same distinctness as in Example 6 was obtained. Ion-etching required about 12 minutes. The rate of ion-etching the image areas of the resulting photomask was smaller than in Example 6.

EXAMPLE 8

The same procedures as described in Example 6 were conducted except for bleaching and fixing the silver image as in Example 4 before baking. In the resulting photomask, the edge of the image was smoother than in Example 4. In this Example, baking was conducted for 1 minute at 400° C.

EXAMPLE 9

On a transparent glass plate was provided a silicon dioxide layer containing metallic silver as an impurity in a thickness of 0.3µ. This layer was produced as follows. That is, a 5 mm-thick quartz plate was placed on a cathode of the same sputtering apparatus as described in Example 1 and silver powder of a mean particle size of 50µ was uniformly spread on the quartz plate so that the surface thereof was not completely covered (the ratio of the area of the silver powder to the area of the uncovered quartz plate in the horizontal plane: about 1:3).

Upon sputtering for about 8 minutes, a yellow silicon dioxide layer (containing silver) was formed on a transparent glass plate placed on an anode. This layer well transmitted light having wavelengths longer than 450 mμ but scarcely transmitted light having shorter wavelengths.

On the thus obtained masking layer was coated a silver halide emulsion layer as described in Example 1 (dry thickness: 5μ). Then, the emulsion layer was processed in the same manner as in Example 1 except for baking as in Example 6, then placed on a quartz plate at a cathode to ion-etch for 18 minutes. The gelatin at non-silver image areas was removed in the first 9 minutes and, in the next 9 minutes, the underlying silicon dioxide layer was removed. However, the silver image areas and the silicon dioxide layer lying thereunder remained. The silver image areas were then removed by immersion in a 20% sodium hydroxide aqueous solution at 40° C. The thus obtained photomask was a see-through type and possessed great durability. In addition, the photomask contained less pin-holes and the reflection at the surface was less than that of conventional hard masks. Also, the silicon dioxide pattern was absolutely the same as that of the first silver image (without side-etching).

EXAMPLE 10

On a transparent glass plate iron was vacuum-deposited in a thickness of 0.1μ. Then, the plate was heated to 450° C. in air to convert the iron to ferric oxide. On this layer was coated a silver halide emulsion layer as described in Example 1 (in a dry thickness of 4.5μ), and a silver image was formed. Further, the silver image was heated for about 3 minutes at 400° C. in air, followed by ion-etching for 16 minutes. The ferric oxide at the non-silver image areas was completely removed, while the ferric oxide at the silver image areas remained. Upon removing the silver image areas, a photomask was obtained.

EXAMPLE 11

The same procedures as in Example 9 were conducted except for directly placing the photographic material on the cathode of the sputtering apparatus without heating in air after forming the silver image. The cathode was heated to 350° C. and, after the emulsion layer was decomposed and colored brown, sputtering was initiated. The subsequent procedures were conducted in the same manner as in Example 9.

EXAMPLE 12

The same procedures as described in Example 7 were conducted except for processing the photographic material, after bleaching, with a developer as described in Example 1 to convert the silver halide image to a silver image and again converting to silver halide image using a bleaching solution as described in Example 1. The subsequent processings were the same as in Example 7.

Every time the gelatin layer was bleached, it was hardened and, at the same time, a chromium compound was produced at the image areas, which served to delay the rate of ion-etching. Therefore, the difference in the rate of ion-etching between the non-image areas and image areas increased. This is extremely important in simultaneously forming a resist image and etching a masking layer. Because, where a substance whose ion-etching rate is small such as chromium is used as a making layer, there is the possibility that the resist image will be etched by ion-etching while etching the chromium layer.

EXAMPLE 13

The same procedures as in Example 12 were conducted except for converting the silver halide image, after the last (second) bleaching, to a silver image with a developer as described in Example 1, and then bleaching again. The subsequent processings were conducted in the same manner as in Example 12.

The ion-etching rate at image areas became much smaller.

EXAMPLE 14

After being developed as in Example 9, a photographic material was immersed in an etch-bleaching solution having the following composition for 3 minutes at 23° C. without fixing. Then, the photographic material was washed with water and dried. The silver image areas were removed through this processing.

| Etch-Bleaching Solution | | |
|---|---|---|
| Solution A | Cupric Chloride | 10 g/l |
| | Citric Acid | 10 g/l |
| Solution B | 3% Hydrogen Peroxide Aqueous Solution | |
| (Upon use, Solution A and Solution B were mixed with each other in a volume ratio of 1:1 to prepare an etch-bleaching solution). | | |

After washing with water and drying, ion-etching was conducted for 12 minutes as in Example 9 to remove the masking layer. The subsequent processings were conducted in the same manner as in Example 9.

EXAMPLE 15

After etch-bleaching as in Example 14, the remaining silver halide at the non-image areas was reduced to silver with a developer as described in Example 1, followed by ion-etching for 12 minutes. The subsequent processings were conducted in the same manner as in Example 9.

EXAMPLE 16

After forming a silver image by developing and fixing as in Example 1, the silver image was etch-bleached as in Example 14. After washing with water and drying, the masking layer was ion-etched as in Example 1 with the exception that the baking was not conducted. The masking layer was the same as in Example 9. Ion-etching required 12 minutes.

EXAMPLE 17

The same procedures as described in Example 1 were conducted except for coating a subbing layer having the following composition on the chromium layer using an immersion method and drying for 15 minutes at 130° C. prior to coating the silver halide photographic emulsion.

| Subbing Solution | |
|---|---|
| A solution prepared by adding to a gelatin dispersion comprising: | |
| Gelatin | 0.4 g |
| Salicylic Acid | 0.12 g |
| Methanol | 0.18 g |
| Ethylene Chloride | 55.0 g |
| Acetone | 15.0 g |

-continued

| Subbing Solution |
|---|
| A solution prepared by adding to a gelatin dispersion comprising: |
| 0.45 g of nitrocellulose (nitrocellulose RS ½; made by Daisel Ltd.) and 10.0 g of acetone under stirring. |

EXAMPLE 18

A photographic material which was the same as that described in Example 1 except that it contained a germanium layer of a thickness of about 0.1µ in place of the chromium layer was used. After being imagewise exposed, the material was development-processed with a tanning developer having the following composition (20° C., 2 minutes). After formation of the silver image, the material was washed for 30 seconds.

| Developer | |
|---|---|
| Pyrogallol | 8 g |
| Sodium Hydroxide | 3 g |
| Ammonium Chloride | 1.5 g |
| Potassium Bromide | 1.5 g |
| Citric Acid | 0.2 g |
| Water to make | 1 l |

After being fixed with a plain hypo fixing solution (about 1 mol/l) for 2 minutes, the emulsion layer at the unexposed areas was washed away with warm water at 60° C. After being washed with water, the material was immersed in a 3% formaldehyde aqueous solution for 30 seconds and dried. Then, the masking layer was ion-etched for 9 minutes in the same manner as in Example 9, and then immersed for 3 minutes in a 20% sodium hydroxide aqueous solution at 40° C. to thereby remove the silver image areas. The thus obtained germanium mask can be used as a photomask having high sensitivity, high resolving power and high durability.

EXAMPLE 19

A photographic material which was the same as that described in Example 1 except that it contained a germanium layer of a thickness of about 0.1µ in place of the chromium layer was used. After the material was imagewise exposed and development-processed, the subsequent processings were conducted as follows. That is, after development, the silver image was bleached, without fixing, in the following bleaching solution (20° C., 2 minutes and 30 seconds). After bleaching, the non-image areas were washed away with warm water at 40° C., followed by washing with water and drying the material.

| Bleaching Solution | |
|---|---|
| Potassium Dichromate | 18 g |
| Hydrochloric Acid (36.5%) | 5 ml |
| Water to make | 1 l |

Then, the uncovered masking layer was ion-etched for 9 minutes in the same manner as in Example 9, followed by immersing the material in a 20% sodium hydroxide aqueous solution at 40° C. for 3 minutes to remove the silver image areas. The thus obtained germanium mask can be used as a photomask having high sensitivity, high resolving power and good durability.

While the invention has been described in detail and with reference to specific embodiments thereof, it will be apparent to one skilled in the art that various changes and modifications can be made therein without departing from the spirit and scope thereof.

What is claimed is:

1. A photomask-forming photographic material which consists of a transparent support which has thereon (1) an etchable masking layer, (2) a subbing layer comprising a thin layer of polyvinyl acetate located directly on the masking layer, and (3) a silver halide emulsion layer located directly on the subbing layer and said masking layer comprises a layer of a metal, a metal oxide, a semi-metal or a chalcogen glass having a thickness ranging from 0.05 to 3 microns and not transmitting ultraviolet light and the subbing layer being by definition a layer the sole function of which is to ultimately adhere the silver halide emulsion layer to the masking layer.

2. The photomask-forming photographic material of claim 1, wherein said subbing layer has a thickness ranging from about 0.1 to 0.5µ.

* * * * *